US011165013B2

(12) United States Patent
Garello et al.

(10) Patent No.: US 11,165,013 B2
(45) Date of Patent: Nov. 2, 2021

(54) SPIN-ORBIT TORQUE MAGNETIC TUNNEL JUNCTION DEVICE AND METHOD OF FABRICATING SAME

(71) Applicant: IMEC vzw, Leuven (BE)

(72) Inventors: Kevin Garello, Leuven (BE); Gouri Sankar Kar, Leuven (BE)

(73) Assignee: IMEC vzw, Leuven (BE)

( * ) Notice: Subject to any disclaimer, the term of this patent is extended or adjusted under 35 U.S.C. 154(b) by 68 days.

(21) Appl. No.: 16/720,517

(22) Filed: Dec. 19, 2019

(65) Prior Publication Data

US 2020/0203598 A1 Jun. 25, 2020

(30) Foreign Application Priority Data

Dec. 21, 2018 (EP) .................................... 18215612

(51) Int. Cl.
*H01L 43/08* (2006.01)
*H01L 43/02* (2006.01)
(Continued)

(52) U.S. Cl.
CPC .............. *H01L 43/02* (2013.01); *H01L 43/10* (2013.01); *H01L 43/12* (2013.01)

(58) Field of Classification Search
CPC .......... H01L 43/02; H01L 43/10; H01L 43/12
(Continued)

(56) References Cited

U.S. PATENT DOCUMENTS

2015/0348606 A1 12/2015 Buhrman et al.
2016/0079518 A1* 3/2016 Pi ........................ G11C 11/1675 257/421

(Continued)

FOREIGN PATENT DOCUMENTS

CN 104393169 A 3/2015
EP 3312841 A1 4/2018

(Continued)

OTHER PUBLICATIONS

Chen, j. Field-free spin-orbit torque switching of composite perpendicular CoFeB/Gd/CoFeB layers utilized for three-terminal magnetic tunnel junctions, Applied Physics Letters, vol. 111, 2017.

(Continued)

*Primary Examiner* — Jami Valentine Miller
(74) *Attorney, Agent, or Firm* — Knobbe, Martens, Olson & Bear, LLP

(57) ABSTRACT

The disclosed technology generally relates to magnetic devices and more particularly to magnetic tunnel junction (MTJ) devices in which switching can be mediated by spin-orbit torque, and further relates to a method of fabricating such devices. In an aspect, a magnetic tunnel junction (MTJ) device includes a spin-orbit torque (SOT) mediating layer, a hard-mask layer used to define a shape of the SOT layer, a magnetic tunnel junction arranged between the SOT layer and the hard-mask layer. The MTJ includes at least a free layer and a reference layer separated by a non-magnetic barrier layer. The device further includes at least two electrical accesses arranged to contact the SOT layer to pass a write current therethrough. To provide field-free switching of the free layer, the device further includes a ferromagnetic element as at least one of a ferromagnetic sublayer of the hard-mask and a material in the electrical accesses.

20 Claims, 1 Drawing Sheet

100
160
120
122
124
150
138
130
132
136
134
110
140
112
142

(51) Int. Cl.
*H01L 43/10* (2006.01)
*H01L 43/12* (2006.01)

(58) Field of Classification Search
USPC .......................................................... 257/421
See application file for complete search history.

(56) References Cited

U.S. PATENT DOCUMENTS

| | | | | |
|---|---|---|---|---|
| 2016/0358973 | A1 | 12/2016 | Katine | |
| 2017/0125078 | A1 | 5/2017 | Mihajlovic et al. | |
| 2017/0148848 | A1 | 5/2017 | Ahn et al. | |
| 2018/0137904 | A1 | 5/2018 | Mihajlovic et al. | |
| 2018/0190419 | A1* | 7/2018 | Swerts | H01F 41/325 |
| 2018/0240966 | A1 | 8/2018 | Mihajlovic et al. | |
| 2019/0006415 | A1* | 1/2019 | Li | H01L 43/08 |
| 2019/0259808 | A1* | 8/2019 | Jacob | H01L 27/228 |
| 2020/0066968 | A1* | 2/2020 | Park | H01F 10/329 |
| 2020/0075843 | A1* | 3/2020 | Nagel | H01L 43/12 |
| 2020/0136018 | A1* | 4/2020 | Ying | G11C 11/1655 |

FOREIGN PATENT DOCUMENTS

| | | | |
|---|---|---|---|
| EP | 3319134 | A1 | 5/2018 |
| EP | 3343655 | A1 | 7/2018 |

OTHER PUBLICATIONS

Wang, M., et al., Field-Free Switching Of Perpendicular Magnetic Tunnel Junction By The Interplay Of Spin Orbit And Spin Transfer Torques, Nature Electronics, vol. 1 pp. 582-588, 2018.

Extended European Search Report dated May 8, 2019 in application 18215612.5.

* cited by examiner

SPIN-ORBIT TORQUE MAGNETIC TUNNEL JUNCTION DEVICE AND METHOD OF FABRICATING SAME

CROSS-REFERENCE TO RELATED APPLICATIONS

This application claims foreign priority to European Patent Application No. EP 18215612.5, filed Dec. 21, 2018, the content of which is incorporated by reference herein in its entirety.

BACKGROUND

Field

The disclosed technology generally relates to magnetic devices and more particularly to magnetic tunnel junction devices in which switching can be mediated by spin-orbit torque. The disclosed technology further relates to a method of fabricating and generating magnetic fields for switching of such devices.

Description of the Related Technology

In systems including magnetic tunnel junctions (MTJs) which utilize switching mediated by spin-orbit torque (SOT), an external magnetic field may be applied to break the symmetry of the system and to obtain deterministic magnetization switching. Such an external magnetic field is often applied in the plane of the MTJ, along the direction of the SOT current. To address this issue, field-free switching of such SOT-controlled MTJs has been suggested by using, for example, different shapes, embedding of permanent magnets and/or by converting the external field to an internal field by the use of antiferromagnetic materials.

However, the use of such alternatives may, for example, demand one or more extra processing steps during fabrication of the systems, and integrate less than optimal within already existing processing flows.

Based on the above, there is therefore a need for an improved way of providing a suitable magnetic field for SOT-controlled switching in MTJs.

SUMMARY OF CERTAIN INVENTIVE ASPECTS

To at least partly fulfill the above need, the present disclosure seeks to provide an improved magnetic tunnel junction (MTJ) device, and a corresponding method of manufacturing thereof, as defined in the independent claims. Further embodiments of the device and method are defined in the dependent claims.

According to a first aspect of the present disclosure, a magnetic tunnel junction (MTJ) device is provided. The MTJ device may include a spin-orbit torque (SOT) layer for providing therethrough at least a write current of the MTJ device. The device may include a hard-mask layer used to define a shape of the SOT layer during manufacturing of the device. The device may include an MTJ. The MTJ may be arranged between the SOT layer and the hard-mask layer used to define the shape of the SOT layer. The MTJ may include a magnetic reference layer, a magnetic free layer, and a non-magnetic barrier layer separating the magnetic reference layer and the magnetic free layer. The device may include at least two electrical accesses (e.g., contacts, vias, or similar vertical electrical connections) which may be arranged to contact the SOT layer to inject/extract the write current. The device may further include a ferromagnetic element which may be configured to induce a magnetic field in the magnetic free layer (of the MTJ) in a direction of the write current through the SOT layer. The ferromagnetic element may be at least one of a ferromagnetic sublayer of the hard-mask layer used to define the shape of the SOT layer, and a material of at least one of the at least two electrical accesses.

For example, including the ferromagnetic element within the hard-mask layer defining the shape of the SOT layer, and by positioning this hard-mask layer away from the SOT layer (e.g., separated by the MTJ), may advantageously facilitate an easy-axis magnetization direction (shape anisotropy) to be aligned with the direction of the SOT writing current and may facilitate field-free switching of the magnetic free layer. Further, the ferromagnetic properties of the hard-mask layer may advantageously be tuned separately from those of the MTJ (stack). The impact on the SOT switching current density may be reduced or eliminated, compared to, for example, prior solutions wherein an in-plane magnet has been integrated below the SOT layer to generate the magnetic field for switching. Advantageously, the ferromagnetic element within the hard-mask layer used to define the shape of the SOT layer may naturally be integrated in the production flow and may not require, e.g., the production or use of additional masks.

The alignment (which, as will be described later herein does not necessarily mean completely parallel with) of the induced magnetic field in a direction of the write current may include using, e.g., shape anisotropy (e.g., by providing an elongated shape of the SOT layer, e.g., in a direction of the SOT current flow). Other alternatives may include the use of antiferromagnetic materials for the directional alignment.

In some embodiments, the hard-mask layer used to define the shape of the SOT layer may include at least one non-magnetic metal sublayer.

In some embodiments, the ferromagnetic element may include a material selected from the group consisting of: Fe, Co, Ni, FeCo, FeCoB, NiFe, NdFeB, WCoFeB, and TaCoFeB.

In some embodiments, the device may further include a further hard-mask layer. The further hard-mask layer may be a hard-mask layer used to define a shape of the MTJ (during, e.g., manufacturing thereof). The further hard-mask layer may be arranged between the MTJ and the hard-mask layer used to define a shape of the SOT layer.

In some embodiments, the at least two electrical accesses may be vias.

In some embodiments, the magnetic free layer may be closer to the SOT layer than the magnetic reference layer. Phrased differently, a distance between the magnetic free layer and the SOT layer may be smaller than a distance between the magnetic reference layer and the SOT layer. It is also envisaged, in other embodiments, that the opposite is true, such that instead it is the magnetic reference layer which is closer to the SOT layer. For example, the order of the layers in the stack of the MTJ 130 may, in some embodiments, be reversed.

In some embodiments, a length of the hard-mask layer used to define the shape of the SOT layer may be greater than a width of the hard-mask layer used to define the shape of the SOT layer. Here, the length may be defined as the size of the hard-mask in the direction of the write current passed through the SOT-layer. Likewise, the width of the hard-mask layer may be defined as the size of the hard-mask in a direction perpendicular to the length direction and to a direction in which the layers of the MTJ are stacked. The remaining dimension of the hard-mask layer then corresponds to a thickness of the hard-mask layer.

In some embodiments, the width may be equal to or greater than a diameter of the MTJ.

In some embodiments, a thickness of the ferromagnetic sublayer may be 5 to 150 nm. Preferably, the thickness of the ferromagnetic sublayer may be 15 to 50 nm. More preferably, the thickness of the ferromagnetic sublayer may be 20 to 30 nm.

In some embodiments, the hard-mask layer used to define the shape of the SOT may be a multilayer including one or more adhesion layers. For example, the hard-mask layer may include, in a stacking order, an adhesion layer, the ferromagnetic sublayer, another adhesion layer, and e.g., a TiN layer. The adhesion layer(s) may for example include one or both of Ru and Ta.

In some embodiments, the material of the at least one of the at least two electrical accesses may include Co and/or FeCo.

In some embodiments, one of the at least two electrical accesses may include Co and the other one of the at least two electrical accesses may include FeCo. In other embodiments, both of the at least two electrical accesses may include a same material, for example Co or FeCo.

In some embodiments, the hard-mask layer used to define the shape of the SOT layer may be metallic.

In some embodiments, the hard-mask layer used to define the shape of the MTJ may be metallic.

According to a second aspect of the present disclosure, a method of manufacturing an SOT-MTJ device is provided. The method may include: providing at least one electrical access configured to contact an SOT layer; providing the SOT layer; depositing an MTJ stack on the SOT layer; shaping of the MTJ stack using etching and a first hard-mask deposited on the MTJ stack; and shaping the SOT layer using etching and a second hard-mask deposited on one of the MTJ stack and the first hard-mask. The method may further include providing a ferromagnetic element as at least one of a material of the at least one electrical access and a ferromagnetic sublayer of the second hard-mask used to shape the SOT layer.

In some embodiments, the method may further include providing at least one further electrical access configured to electrically contact the SOT layer.

Embodiments of the method as described above may be beneficial in that they integrate well with current methods for fabrication of SOT-MTJ device, while they enable also the provision of the ferromagnetic element used to obtain the benefits as describe herein with reference to the device of the first aspect.

The present disclosure relates to all possible combinations of features mentioned herein, including the ones listed above as well as other features which will be described in what follows with reference to different embodiments. Any embodiment described herein may be combinable with other embodiments also described herein, and the present disclosure relates also to all such combinations. For example, all limitations specified herein with reference to the MTJ device according to the first aspect may apply also to (and/or be combinable with) the method according to the second aspect, and vice versa. Further objects and advantages of the various embodiments of the present disclosure will be described below by means of exemplifying embodiments.

BRIEF DESCRIPTION OF THE DRAWINGS

Exemplifying embodiments will be described below with reference to the accompanying drawings, in which.

Figure 1A:
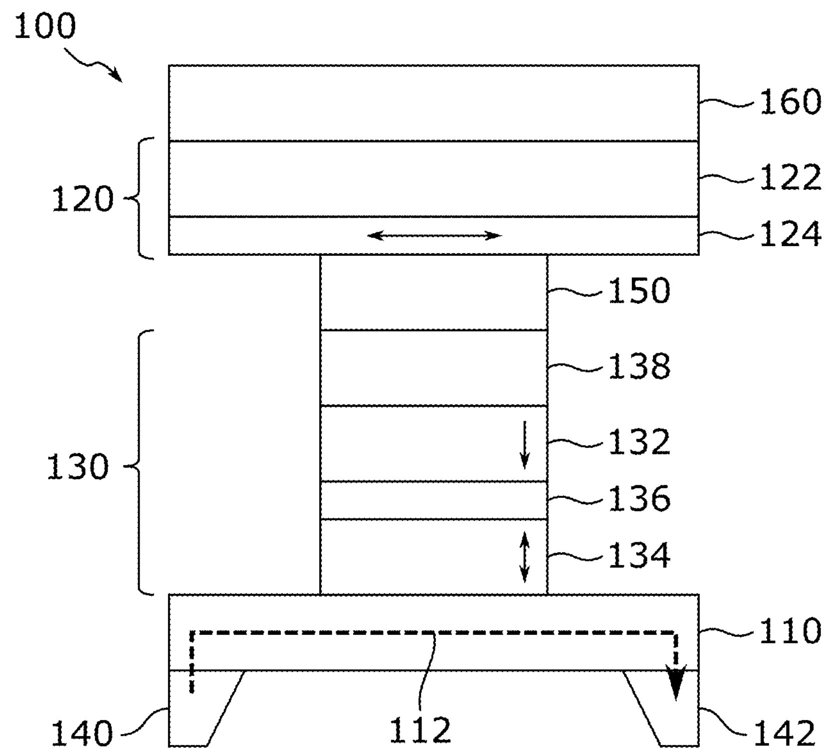
FIG. 1*a* schematically illustrates an embodiment of a magnetic tunnel junction device according to the present disclosure, and FIG. 1*b* schematically illustrates another embodiment of a magnetic tunnel junction device according to the present disclosure.

In the drawings, like reference numerals will be used for like elements unless stated otherwise. Unless explicitly stated to the contrary, the drawings show only such elements that are necessary to illustrate the example embodiments, while other elements, in the interest of clarity, may be omitted or merely suggested. As illustrated in the figures, the sizes of elements and regions may be exaggerated for illustrative purposes and, thus, are provided to illustrate the general structures of the embodiments.

DETAILED DESCRIPTION OF CERTAIN ILLUSTRATIVE EMBODIMENTS

Exemplifying embodiments of an MTJ device according to the present disclosure will now be described more fully hereinafter with reference to the accompanying drawings. The drawings show currently preferred embodiments, but the invention may, however, be embodied in many different forms and should not be construed as limited to the embodiments set forth herein; rather, these embodiments are provided for thoroughness and completeness, and fully convey the scope of the present disclosure to the skilled person. The drawings show cross-sections of devices, and it is envisaged that the devices may of course extend in directions perpendicular to the plane of the cross-sections. The various layers illustrated in the figures may of course also extend laterally/horizontally beyond the illustrated portions, which are for illustrative purposes only.

With reference to FIG. 1, an embodiment of an MTJ device according to the present disclosure will now be described in more detail.

FIG. 1 illustrates schematically a device 100. The device 100 can be, in this embodiment, a memory device and includes a spin-orbit torque (SOT) layer 110, contacted by two electrical accesses 140 and 142. The electrical accesses 140 and 142 may be used to inject/extract a write current 112 in/from the SOT layer 110, such that the write current 112 may be passed through the SOT layer 110. The electrical accesses 140 and 142 may, for example, serve as electrodes in contact with the SOT layer 110. The electrical accesses 140 and 142 may, for example, include vias between, e.g., electrodes or metal lines and the SOT layer 110.

The device 100 further includes a magnetic tunnel junction (MTJ) 130. The MTJ 130 includes a magnetic reference layer 132, having a magnetization which is fixed in a particular direction, such as an up direction or a down direction perpendicular to a planar direction of the magnetic reference layer 132, as illustrated by the arrow in the magnetic reference layer 132. The MTJ also includes a magnetic free layer 134, wherein the direction of magnetization is not fixed but allowed to change between, e.g., up or down directions perpendicular to the planar direction of the magnetic free layer 134, as illustrated by the double-ended arrow in the magnetic free layer 134, and for example by the application of a magnetic field. The magnetic reference layer 132 and the magnetic free layer 134 are separated by a non-magnetic barrier layer 136.

In the particular embodiment shown in FIG. 1*a*, a pinning layer 138 is also provided to pin the direction of magnetization in the magnetic reference layer 132. The pinning layer 138 is provided on top of the magnetic reference layer 132, and may for example be a synthetic antiferromagnetic (SAF) layer. In general, it will be appreciated that the reference layer 132, the free layer 134 and the pinning layer 138 (if included) may be formed of, or at least include, materials that possess perpendicular magnetic anisotropy (PMA). The pinning layer 138 may in turn include multiple sublayers (not shown), for example first and second magnetic sublayers separated by a thin metal layer. The pinning layer 138 may for example be used to compensate a stray field generated by the reference layer 132 on the free layer 134. Such a compensation may further improve the performance of the MTJ device 100.

Examples of materials for the reference layer 132 may include Fe, Co, CoFe, CoB, FeB, WCoFeB and CoFeB. Other suitable materials may for example include Ni, FePt, CoGd, CoFeGd, CoFeTb, and CoTb. It is envisaged that the reference layer 132 may have a multi-layer structure including combinations of the aforementioned materials. The barrier layer 136 may for example include a layer of a dielectric material, for example MgO, AlOx, MgAlOx or MgTiOx and may be adapted to allow electrons to tunnel between the reference layer 132 and the free layer 134.

The SOT layer 110 may include a layer of an electrically conducting material presenting a relatively large spin-orbit coupling. The SOT layer 110 may be non-magnetic, and example materials for the SOT layer 110 may include metals such as Ta, W, Pt, Pd, Ir, IrMn, PtMn, W, WOx, WN, W(O,N), AuPt, Hf, PtHf, FeMn, NiMn or topological insulators such as $Bi_xSe_{1-x}$, $Bi_xSb_{1-x}$, $(Bi,Sb)_2Te_3$ or transition metal dichalcogenide (TMD) such as $MoS_2$, $WTe_2$. The SOT layer 110 may also have a multi-layer structure, e.g., including a combination of any of the above-mentioned materials. The SOT layer 110 may be formed with a thickness of e.g. 10 nm or less, preferably 5 nm or less, and may be formed using conventional deposition techniques such as evaporation or sputtering or molecular beam epitaxy (MBE), or atomic layer deposition (ALD), or metal organic chemical vapor deposition (MOCVD).

As the reference layer 132 is arranged above the free layer 134, the device 100 as described with reference to FIG. 1*a* may be referred to as a "top-pinned" MTJ device. The pinning of the reference layer 132 may be achieved via ferromagnetic exchange coupling through a spacer layer with a hard magnetic layer. The spacer may for example include Ta, W, Mo, CoFeBTa, CoFeBW, CoBTa, FeBTa, CoBW, FeBW, FeTa, CoTa, FeW, TaW, Ru or combinations thereof. In some cases, pinning may be achieved by coupling the reference layer 132 through a spacer layer to a Co/Ru/hard magnetic layer pinning system. The hard magnetic layer may include a combination of a Co-layer and a Pt-layer, a combination of a Co-layer and a Ni-layer, a combination of a Co-layer and a Pd-layer, MnGe alloys, MnGa alloys, CoPt alloys, CoNi alloys or FePt alloys. It is envisaged that any such arrangement of layers and materials, used to pin the magnetization direction in the reference layer 132, may for example form part of the pinning layer 138.

During fabrication of the MTJ stack 130, a hard-mask layer 150 can be added on top of the MTJ stack 130 in order to define a shape of the MTJ stack 130, e.g., by etching. In some embodiments, it is envisaged that the hard-mask stack 150 used to define the shape of the MTJ (stack) 130 may be removed and not included in the device 100. The hard-mask layer 150 may include e.g. TiN, TaN, TiTaN and spin-on-carbon/spin-on-glass materials. The hard-mask layer 150 for instance have a rectangular or elliptical or round shape as viewed in a direction in the plane of FIG. 1*a*. During fabrication of the device 100, the hard-mask layer 150 may define the size and shape of the stack of layers making up the MTJ 130 by etching regions of the stack of layers 130 which are exposed by the hard-mask 150. Such etching techniques may include e.g. anisotropic etch processes such as reactive-ion-etching (ME) or ion-beam-etching (IBE). In the device 100 in FIG. 1*a*, such etching has proceeded down until the bottom of the free layer 134. Thus fabricated MTJ stack 130 and the hard-mask layer 150 can be coextensive in one or more lateral directions, e.g., direction parallel and perpendicular to the direction of current flow in the SOT layer 110.

During fabrication of the device 100, a hard-mask layer 120 has also been included to define a shape of the SOT layer 110, e.g., by etching. As illustrated in FIG. 1*a*, it is envisaged that the hard-mask layer 120 and the SOT layer 110 are arranged such that the MTJ (stack) 130 is arranged between the SOT layer 110 and the hard-mask layer 120. It may be envisaged that, during fabrication of the device 100, etching of the MTJ 130 may be performed first, and that, e.g., an oxide material (not shown) is provided at the sides of the MTJ up to the top of the hard-mask layer 150. The hard-mask layer 120 is then added and modified to a desired shape, after which another etching step is performed in order to remove oxide and part of the SOT layer 110 exposed by the hard-mask layer 120. Thus fabricated SOT layer 110 and the hard-mask layer 120 can be coextensive in one or more lateral directions, e.g., direction parallel and perpendicular to the direction of current flow in the SOT layer 110.

A length of the hard-mask layer 120 (e.g., in a direction of the current 112) may be larger than a width of the hard-mask layer 120 (e.g., in the direction perpendicular to the plane of FIG. 1*a*). In some embodiments, it may be assumed that the MTJ 130 is shaped as a pillar, extending in the stacking order of the layers making up the MTJ 130. The width of the hard-mask layer 120 may then for example be at least two times a diameter of the MTJ 130, and the width of the hard-mask layer may for example be at least equal to the diameter of the MTJ 130.

In the embodiment of the device 100 as illustrated in FIG. 1*a*, a ferromagnetic element is introduced as a ferromagnetic sublayer 124 of the hard-mask layer 120 used to define the shape of the SOT layer. In some embodiments, a thickness of the ferromagnetic element/sublayer 124 may be 5 to 150 nm, preferably 15 to 50 nm, or more preferably 20 to 30 nm. In some embodiments, the hard-mask layer 120 may be multilayered, and include also e.g. a non-magnetic metal sublayer 122.

The ferromagnetic element, e.g. of the ferromagnetic sublayer 124, may preferably include Co and/or CoFe, or any other suitable ferromagnetic material, the composition of which provides a sufficient or optimized ratio between the generated in-plane magnetic field and the thickness of the layer/material.

As an example, a diameter of the MTJ 130 may be approximately 50 nm. A length of the hard-mask 120 may be approximately 390 nm, a width of the hard-mask 120 may be approximately 110 nm, and a thickness of the ferromagnetic sublayer 124 may be approximately 26 nm. If Co is used as the material of the ferromagnetic sublayer 124, and if a distance between the ferromagnetic sublayer 124 and the free layer 134 of the MTJ 130 is approximately 75 nm, a generated in-plane magnetic field in the direction of the write current may correspond to approximately 14 mT. With an increased thickness of the ferromagnetic sublayer 124 of approximately 50 nm, the same field may be approximately 35 mT.

As another example, with a diameter of the MTJ of approximately 50 nm, a length of the hard-mask layer of approximately 100 nm, a width of 50 nm, a thickness of approximately 256 nm, the same material (Co), a distance of separation of approximately 75 nm, the corresponding in-plane magnetic field may be approximately 16 mT. Each such field size may be sufficient to obtain the desired field-free switching of the free layer of the MTJ.

Herein, "field-free switching" means not that no magnetic field is present, but that such a field is not an external magnetic field. Instead, as described herein, the magnetic field is generated internally within the device, by the addition of the ferromagnetic element within e.g. the hard-mask used to define the shape of the SOT layer and/or the electrical accesses.

The switching of magnetization in the magnetic free layer 134 may be mediated by spin-orbit torques (SOTs) which may be generated by conduction of the current through the SOT layer 110. However, a magnetic field in the plane of the MTJ 130 and in the direction of the SOT write current is needed to break the symmetry of the system and to obtain a deterministic magnetization switching. To provide field-free switching in the device 100, e.g., without having to supply the needed field in the form of an external magnetic field, the hard-mask layer 120 includes a ferromagnetic element in the form of a ferromagnetic sublayer 124 of the hard-mask layer 120. The in-plane magnetic stray field radiated by this ferromagnetic element/sublayer 124 lies, as illustrated by the arrow in the layer 124, in the direction of the write current 112. This magnetic field may influence the magnetic free layer 134, and induce the field-free switching of the magnetic free layer 134. Information may be stored in the free layer 134 (e.g., information such as a bit, the value of which depending on whether the direction of magnetization in the free layer 134 lies in one direction or another (opposite) direction. The device 100 may for example be a memory device used in SOT-MRAM technology, although it is envisaged that the device 100, and other devices described herein, may also be other devices than memory devices.

The hard-mask layer 120, as shown in FIG. 1*a*, may also include at least one non-magnetic metal sublayer 124. Such a non-magnetic metal sublayer may for example include or consist of TiN, Ru, TaN, Ta, Ti, or C.

With respect to the device 100 as illustrated in FIG. 1*a*, it is envisaged also that, e.g., the stack making up the MTJ 130 may be provided in an opposite order, such that the magnetic free layer 134 is above the magnetic reference layer 132 (e.g., more distant from the SOT layer 110 than the reference layer 132). Such an arrangement may be referred to as a "bottom-pinned" device.

Also with respect to the device 100 as illustrated in FIG. 1*a*, it is envisaged also that, if the hard-mask layer 120 includes more than one sublayer, that the ferromagnetic element/sublayer 124 is not necessarily on the bottom. In the embodiment of the device 100 as shown in FIG. 1*a*, it may for example be envisaged that the sublayer 124 is instead above the sublayer 122. Further, the hard-mask 120 may also include more than two sublayers. For example, the hard-mask 120 layer may for example be structured as NM1/NM2/ . . . /FM/ . . . /NM(n-1)/NMn, where NMj indicates a non-magnetic (metal) sublayer and FM the ferromagnetic sublayer. The non-magnetic sublayers may for example be included for purposes of adhesion, as protection layers for the FM sublayer to a CMP/etch step (as consumables), or as CMP stop layers, etc. As an example, the hard-mask layer 120 may include e.g., an adhesion layer of for example Ru and/or Ta with a thickness of approximately 5 nm, followed by the ferromagnetic sublayer 124, followed by an additional adhesion layer (Ru and/or Ta, and approximately 5 nm thick), followed by a standard hard-mask metal layer (such as TiN) width a thickness of approximately 150 nm. The standard hard-mask metal layer may for example be the non-magnetic metal sublayer 122.

In summary, the embodiment of the device 100 as illustrated in FIG. 1*a* may be modified in at least four versions. A first such version may be as illustrated in FIG. 1*a*, a second such version may include switching the order of the sublayers 122 and 124, a third such version may include switching the order of the layers in the stack making up the MTJ 130 (e.g., at least the layers 132 and 134, moving from a top-pinned to a bottom-pinned configuration), and a fourth such version may include switching both the order of the sublayers 122 and 124 and the order of the layers in the MTJ 130.

In the device 100, a top electrode/contacting layer 160 is also provided. The layer 160 may for example be metallic or include one or more metals, and the layer 160 may contact e.g. the MTJ 130 in order to allow for a reading current to be sent through the MTJ 130, e.g. from/to one of the electrical accesses 140 and 142, through the MTJ 130 and to/from the hard-mask layer 120 and the contacting/electrode layer 160. Herein, it is envisaged that the hard-mask layer 120 and the hard-mask layer 150 are metallic hard-masks such that they may conduct such a current. In other embodiments, it is envisaged that one or both of the hard-mask layer 120 and the hard-mask layer 150 may be non-metallic, and, e.g., insulating or semiconducting.

Figure 1B:
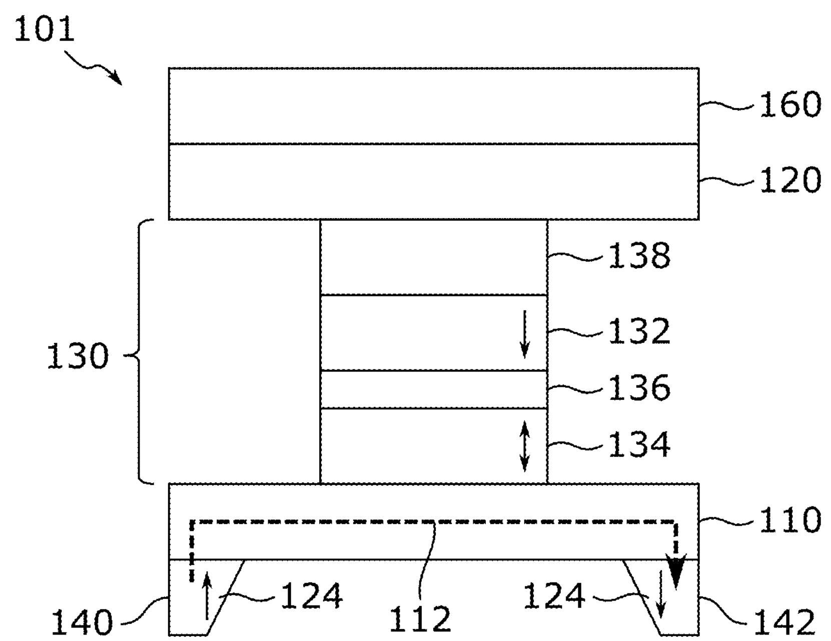

With reference to FIG. 1*b*, another embodiment of a device according to the present disclosure will now be described in more detail.

FIG. 1*b* illustrates a device 101, identical to the device 100 described with reference to FIG. 1*a* except that the ferromagnetic element 124 is not provided as a sublayer of the hard-mask 120, but instead included in the two electrical accesses 140 and 142. The functionality of such a device is the same, and the magnetic stray field generated by the ferromagnetic element 124 are as described earlier herein used to provide the deterministic switching of the free layer 134 and the needed breaking of the symmetry of the system. In other embodiments of the device 101, it is envisaged that, e.g., the order of the layers forming the MTJ 130 may be reversed, changing from a top-pinned to a bottom-pinned structure.

The electrical accesses 140 and 142 may for example include Co and/or FeCo. In some embodiments, at least one of the electrical access 140 and 142 may include Co and the other one of the electrical accesses 140 and 142 may include FeCo.

According to the present disclosure, it is also envisaged that the e.g. the two devices 100 and 101 as described with reference to FIGS. 1*a* and 1*b*, respectively, may be combined, such that ferromagnetic elements are provided both as a ferromagnetic sublayer of the hard-mask layer used to define the shape of the SOT layer, and in the electrical accesses.

In general, the present disclosure provides an improved way of providing the magnetic field required to obtain deterministic switching of the free layer in an MTJ device relying on SOT, and to break the symmetry of the system. By providing such a magnetic field by including a ferromagnetic element within e.g. a hard-mask layer used to define the shape of the SOT layer, or within electrical accesses, the magnetic field may be provided internally without the need for an external magnetic field. As described earlier herein, the shape of the hard-mask layer may allow to favor an easy-axis magnetization direction (shape anisotropy) aligned with the SOT writing current, which may be preferred for efficient field-free switching). Herein, "aligned with the SOT writing current" is to be interpreted as also including magnetization direction which is not completely parallel with the SOT writing current, but that e.g. has an angle thereto. However, it is envisaged that the magnetization direction is not perpendicular with respect to the SOT writing current, as this may provide an undesired random switching. Likewise, the ferromagnetic properties may be tuned separately from the MTJ stack, without impacting the SOT switching current density. In addition, the choice of metal for the SOT layer may be made unrestricted or at least more free. In addition, including the ferromagnetic element within e.g. the hard-mask used to define the shape of the SOT layer may fit naturally into the processes/integration flow without requiring additional technology mask, thereby providing a reduced cost or at least limited cost. As a further benefit, the device as suggested by the present disclosure may provide the sufficient fields necessary to generate the field-free switching even during variations in the fabrication processes of the device. For example, as described herein, the present disclosure suggests to separate the SOT layer from the hard-mask used to define the shape of the SOT (by inserting therebetween the MTJ), but variations in the exact separation distance due to process variations may still be allowed.

Although features and elements are described above in particular combinations, each feature or element may be used alone without the other features and elements or in various combinations with or without other features and elements. The same applies to methods and individual method steps, which may be used alone or in combination also in other order if not explicitly indicated otherwise.

Additionally, variations to the disclosed embodiments can be understood and effected by the skilled person in practicing the claimed invention, from a study of the drawings, the disclosure, and the appended claims. Even if the inventive concept of the present disclosure has mainly been described with reference to a limited number of examples/embodiments, it is readily appreciated by the skilled person that other examples than the ones disclosed above are equally possible within the scope of the inventive concept, as defined by the appended claims.

In the claims, the word "comprising" does not exclude other elements, and the indefinite article "a" or "an" does not exclude a plurality. The mere fact that certain features are recited in mutually different dependent claims does not indicate that a combination of these features cannot be used to advantage.

What is claimed is:

1. A magnetic tunnel junction (MTJ) device, comprising:
- a spin-orbit torque (SOT) layer for providing therethrough at least a write current of the MTJ device;
- a hard-mask layer defining a shape of the SOT layer;
- a magnetic tunnel-junction (MTJ) arranged between the SOT layer and the hard-mask layer, wherein the MTJ includes a magnetic reference layer, a magnetic free layer, and a non-magnetic barrier layer separating the magnetic reference layer and the magnetic free layer;
- at least two electrical accesses arranged to contact the SOT layer to inject/extract the write current; and
- a ferromagnetic element configured to induce a magnetic field in the magnetic free layer in a direction of the write current through the SOT layer, wherein the ferromagnetic element comprises one or both of:
- a ferromagnetic sublayer of the hard-mask layer, wherein a thickness of the ferromagnetic sublayer is 5 to 150 nm, and
- a material of at least one of the at least two electrical accesses.

2. The MTJ device of claim 1, wherein the ferromagnetic element includes a material selected from the group consisting of Fe, Co, Ni, FeCo, FeCoB, NiFe, NdFeB, WCoFeB, or TaCoFeB.

3. A magnetic tunnel junction (MTJ) device, comprising:
- a spin-orbit torque (SOT) layer for providing therethrough at least a write current of the MTJ device;
- a hard-mask layer defining a shape of the SOT layer;
- a magnetic tunnel-junction (MTJ) arranged between the SOT layer and the hard-mask layer, wherein the MTJ includes a magnetic reference layer, a magnetic free layer, and a non-magnetic barrier layer separating the magnetic reference layer and the magnetic free layer;
- at least two electrical accesses arranged to contact the SOT layer to inject/extract the write current;
- a ferromagnetic element configured to induce a magnetic field in the magnetic free layer in a direction of the write current through the SOT layer, wherein the ferromagnetic element comprises one or both of:
  - a ferromagnetic sublayer of the hard-mask layer, and
  - a material of at least one of the at least two electrical accesses; and
- a further hard-mask layer defining a shape of the MTJ and arranged between the MTJ and the hard-mask layer.

4. A magnetic tunnel junction (MTJ) device, comprising:
- a spin-orbit torque (SOT) layer for providing therethrough at least a write current of the MTJ device;
- a hard-mask layer defining a shape of the SOT layer;
- a magnetic tunnel-junction (MTJ) arranged between the SOT layer and the hard-mask layer, wherein the MTJ includes a magnetic reference layer, a magnetic free layer, and a non-magnetic barrier layer separating the magnetic reference layer and the magnetic free layer;
- at least two electrical accesses arranged to contact the SOT layer to inject/extract the write current, wherein the at least two electrical accesses comprise vias;
- a ferromagnetic element configured to induce a magnetic field in the magnetic free layer in a direction of the write current through the SOT layer, wherein the ferromagnetic element comprises one or both of:
- a ferromagnetic sublayer of the hard-mask layer, and
- a material of at least one of the at least two electrical accesses.

5. A magnetic tunnel junction (MTJ) device, comprising:
- a spin-orbit torque (SOT) layer for providing therethrough at least a write current of the MTJ device;
- a hard-mask layer defining a shape of the SOT layer;
- a magnetic tunnel-junction (MTJ) arranged between the SOT layer and the hard-mask layer, wherein the MTJ includes a magnetic reference layer, a magnetic free layer, and a non-magnetic barrier layer separating the magnetic reference layer and the magnetic free layer, wherein the magnetic free layer is closer to the SOT layer than the magnetic reference layer;
- at least two electrical accesses arranged to contact the SOT layer to inject/extract the write current; and
- a ferromagnetic element configured to induce a magnetic field in the magnetic free layer in a direction of the write current through the SOT layer, wherein the ferromagnetic element comprises one or both of:

a ferromagnetic sublayer of the hard-mask layer, and
a material of at least one of the at least two electrical accesses.

6. A magnetic tunnel junction (MTJ) device, comprising:
a spin-orbit torque (SOT) layer for providing therethrough at least a write current of the MTJ device;
a hard-mask layer defining a shape of the SOT layer, wherein the hard-mask layer is elongated to have a length in the direction of the write current that is greater than a width of the hard-mask layer in a direction perpendicular to the direction of the direction of the write current;
a magnetic tunnel-junction (MTJ) arranged between the SOT layer and the hard-mask layer, wherein the MTJ includes a magnetic reference layer, a magnetic free layer, and a non-magnetic barrier layer separating the magnetic reference layer and the magnetic free layer;
at least two electrical accesses arranged to contact the SOT layer to inject/extract the write current; and
a ferromagnetic element configured to induce a magnetic field in the magnetic free layer in a direction of the write current through the SOT layer, wherein the ferromagnetic element comprises one or both of:
a ferromagnetic sublayer of the hard-mask layer, and
a material of at least one of the at least two electrical accesses.

7. The MTJ device of claim 6, wherein the width is equal to or greater than a diameter of the MTJ.

8. The MTJ device of claim 1, wherein the hard-mask layer includes at least one non-magnetic metal sublayer.

9. A magnetic tunnel junction (MTJ) device, comprising:
a spin-orbit torque (SOT) layer for providing therethrough at least a write current of the MTJ device;
a hard-mask layer defining a shape of the SOT layer;
a magnetic tunnel-junction (MTJ) arranged between the SOT layer and the hard-mask layer, wherein the MTJ includes a magnetic reference layer, a magnetic free layer, and a non-magnetic barrier layer separating the magnetic reference layer and the magnetic free layer;
at least two electrical accesses arranged to contact the SOT layer to inject/extract the write current, wherein at least one of the at least two electrical accesses includes Co and/or FeCo; and
a ferromagnetic element configured to induce a magnetic field in the magnetic free layer in a direction of the write current through the SOT layer, wherein the ferromagnetic element comprises one or both of:
a ferromagnetic sublayer of the hard-mask layer, and
a material of at least one of the at least two electrical accesses.

10. The MTJ device of claim 9, wherein one of the at least two electrical accesses includes Co and another one of the at least two electrical accesses includes FeCo.

11. The MTJ device of claim 6, wherein the hard-mask layer is metallic.

12. The MTJ device of claim 3, wherein the further hard-mask layer is metallic.

13. The MTJ device of claim 6, wherein the SOT layer and the hard-mask layer is co-extensive in directions parallel and perpendicular to the direction of the write current.

14. The MTJ device of claim 6, wherein the direction of the write current is in a direction that is crossed by a direction of stacking of the MTJ.

15. A method of fabricating a spin-orbit torque (SOT) magnetic tunnel junction (MTJ) device, the method comprising:
providing at least one electrical access configured to electrically contact an SOT layer;
providing the SOT layer;
providing an MTJ stack on the SOT layer;
shaping the MTJ stack by etching using a first hard-mask provided on the MTJ stack;
shaping the SOT layer by etching using a second hard-mask provided on the SOT layer; and
providing a ferromagnetic element as one or both of a material of the at least one electrical access and a ferromagnetic sublayer of the second hard-mask.

16. The method of claim 15, further comprising providing at least one further electrical access configured to electrically contact the second hard-mask.

17. The MTJ device of claim 3, wherein the hard-mask layer includes at least one non-magnetic metal sublayer.

18. The MTJ device of claim 4, wherein the hard-mask layer includes at least one non-magnetic metal sublayer.

19. The MTJ device of claim 5, wherein the hard-mask layer includes at least one non-magnetic metal sublayer.

20. The MTJ device of claim 7, wherein the hard-mask layer includes at least one non-magnetic metal sublayer.

* * * * *